United States Patent
Kapoor et al.

(10) Patent No.: US 7,943,971 B1
(45) Date of Patent: May 17, 2011

(54) JUNCTION FIELD EFFECT TRANSISTOR (JFET) STRUCTURE HAVING TOP-TO-BOTTOM GATE TIE AND METHOD OF MANUFACTURE

(75) Inventors: Ashok K. Kapoor, Palo Alto, CA (US); Damodar R. Thummalapally, Milpitas, CA (US)

(73) Assignee: SuVolta, Inc., Los Gatos, CA (US)

( * ) Notice: Subject to any disclaimer, the term of this patent is extended or adjusted under 35 U.S.C. 154(b) by 126 days.

(21) Appl. No.: 12/316,944

(22) Filed: Dec. 17, 2008

(51) Int. Cl.
*H01L 21/337* (2006.01)
*H01L 29/80* (2006.01)

(52) U.S. Cl. ........... 257/256; 257/347; 257/E21.446; 257/E21.646; 257/E29.057; 257/E29.059

(58) Field of Classification Search .......... 257/67, 257/259, 298, 316, 347, 401, 509, E21.415, 257/E21.646, E21.703, E27.086, E27.112, 257/E21.446, E29.275, E29.278, E29.286, 257/E29.057, E29.059; 438/239, 208, 294, 438/152; 365/149, 174, 185.26
See application file for complete search history.

(56) References Cited

U.S. PATENT DOCUMENTS

| | | | |
|---|---|---|---|
| 3,930,300 A | 1/1976 | Nicolay | |
| 3,951,702 A | 4/1976 | Kano et al. | |
| 4,036,672 A | 7/1977 | Kobayashi | |
| 4,062,036 A | 12/1977 | Yoshida | |
| 4,333,224 A | 6/1982 | Buchanan | |
| 4,751,556 A | 6/1988 | Cogan et al. | |
| 4,777,517 A | 10/1988 | Onodera et al. | |
| 4,839,305 A | 6/1989 | Brighton | |
| 5,026,654 A | 6/1991 | Tanba et al. | |
| 5,130,770 A | 7/1992 | Blanc et al. | |
| 5,618,688 A | 4/1997 | Reuss et al. | |
| 5,773,891 A | 6/1998 | Delgado et al. | |
| 5,973,341 A | 10/1999 | Letavic et al. | |
| 6,307,223 B1 | 10/2001 | Yu | |
| 2002/0197779 A1 | 12/2002 | Evans | |
| 2004/0140520 A1* | 7/2004 | Kim et al. | 257/509 |
| 2007/0096144 A1 | 5/2007 | Kapoor | |
| 2007/0284628 A1 | 12/2007 | Kapoor | |
| 2008/0001183 A1 | 1/2008 | Kapoor | |

FOREIGN PATENT DOCUMENTS

GB    2 208 967 A    4/1989

* cited by examiner

*Primary Examiner* — Victor Mandala
*Assistant Examiner* — Whitney Moore
(74) *Attorney, Agent, or Firm* — Haverstock & Owens, LLP

(57) ABSTRACT

A junction field effect transistor (JFET) can include a top gate structure and an active semiconductor region. The active semiconductor region can include a side surface and a top surface formed below the top gate structure. The active semiconductor region can also include a channel region formed below the top gate structure, a bottom gate region formed below the channel region, and a gate tie region formed on the side surface that makes an electrical connection between the top gate structure and the bottom gate region.

1 Claim, 14 Drawing Sheets

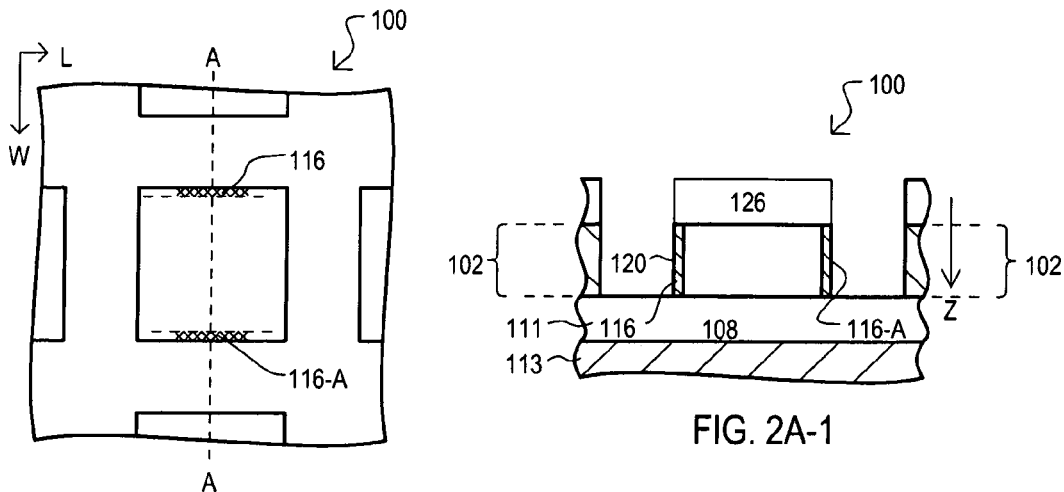
FIG. 2A-0
FIG. 2A-1
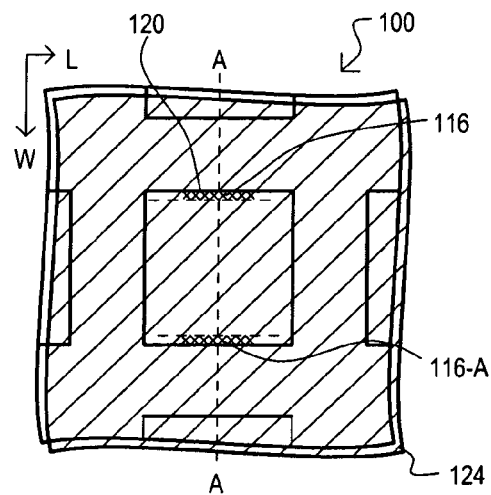
FIG. 2B-0
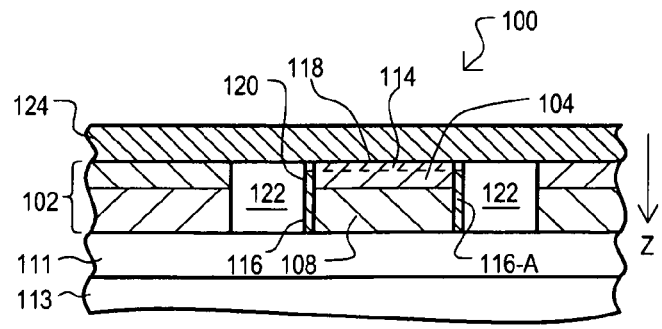
FIG. 2B-1

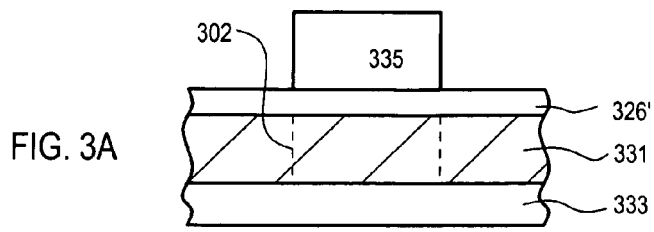
FIG. 3A
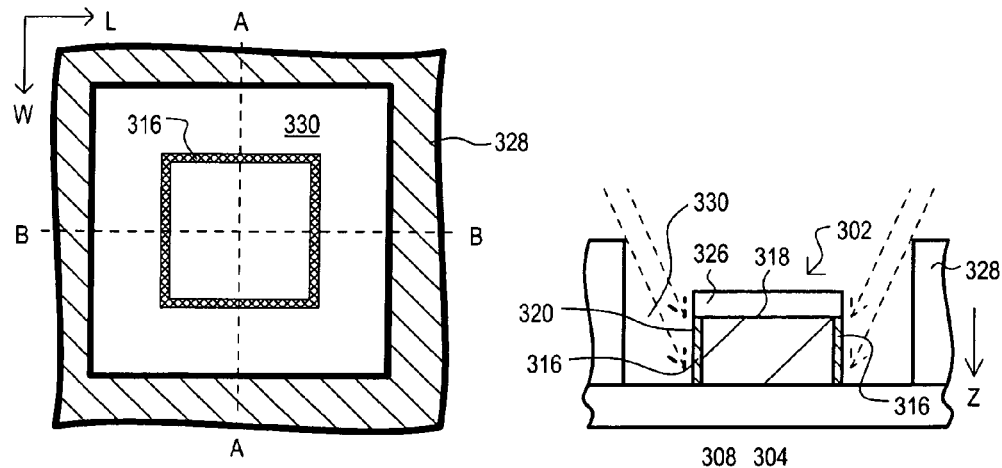
FIG. 3B-0
FIG. 3B-1
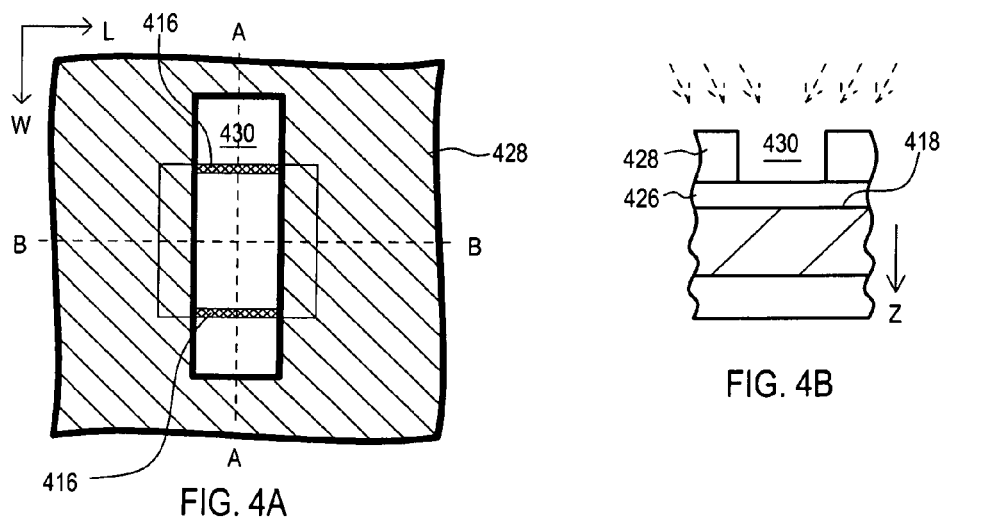
FIG. 4A
FIG. 4B
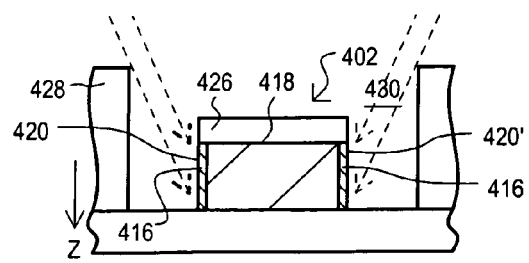
FIG. 4C

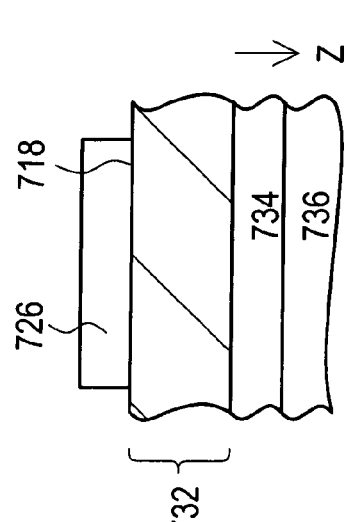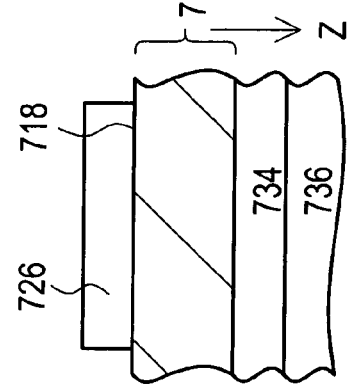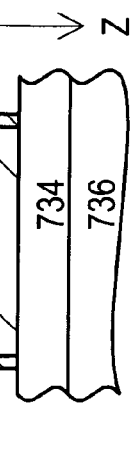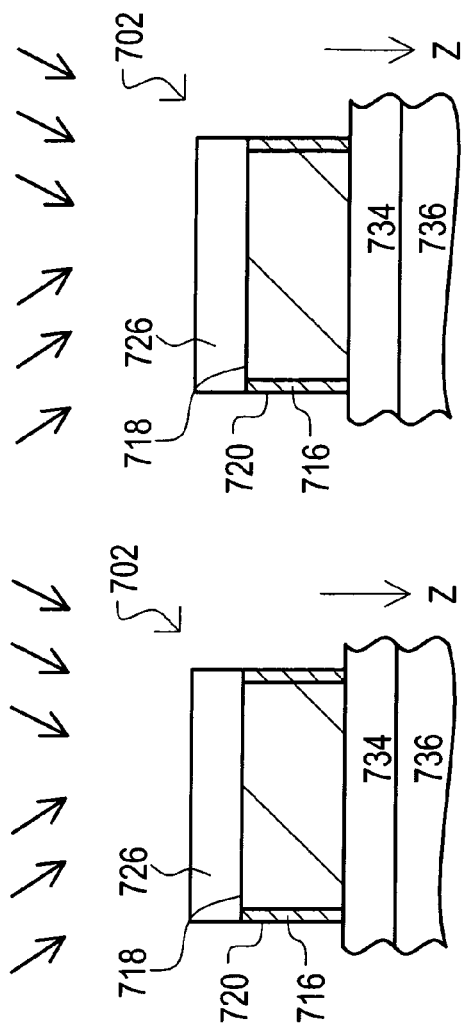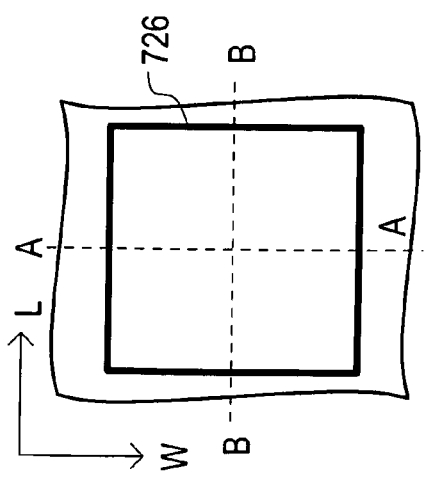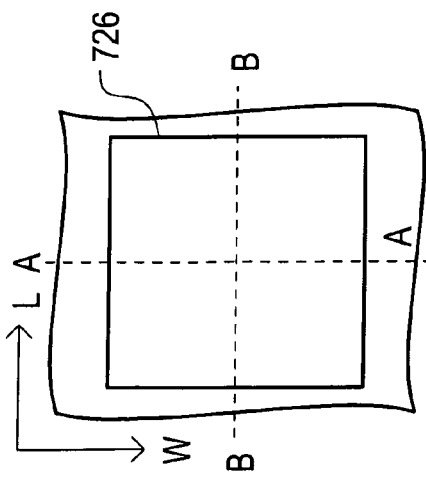

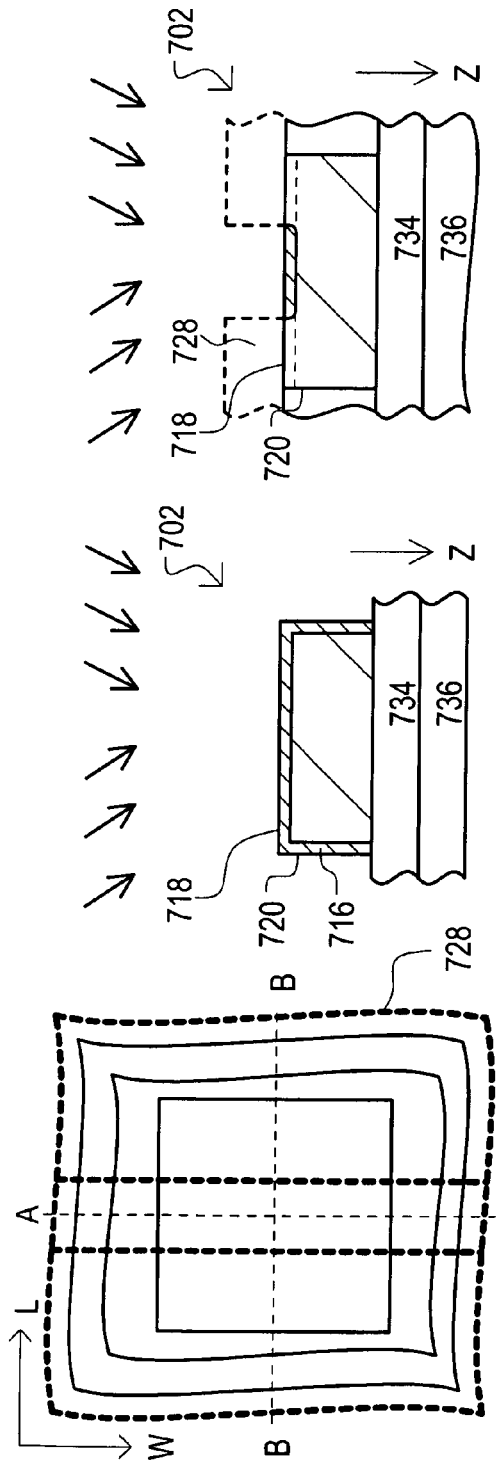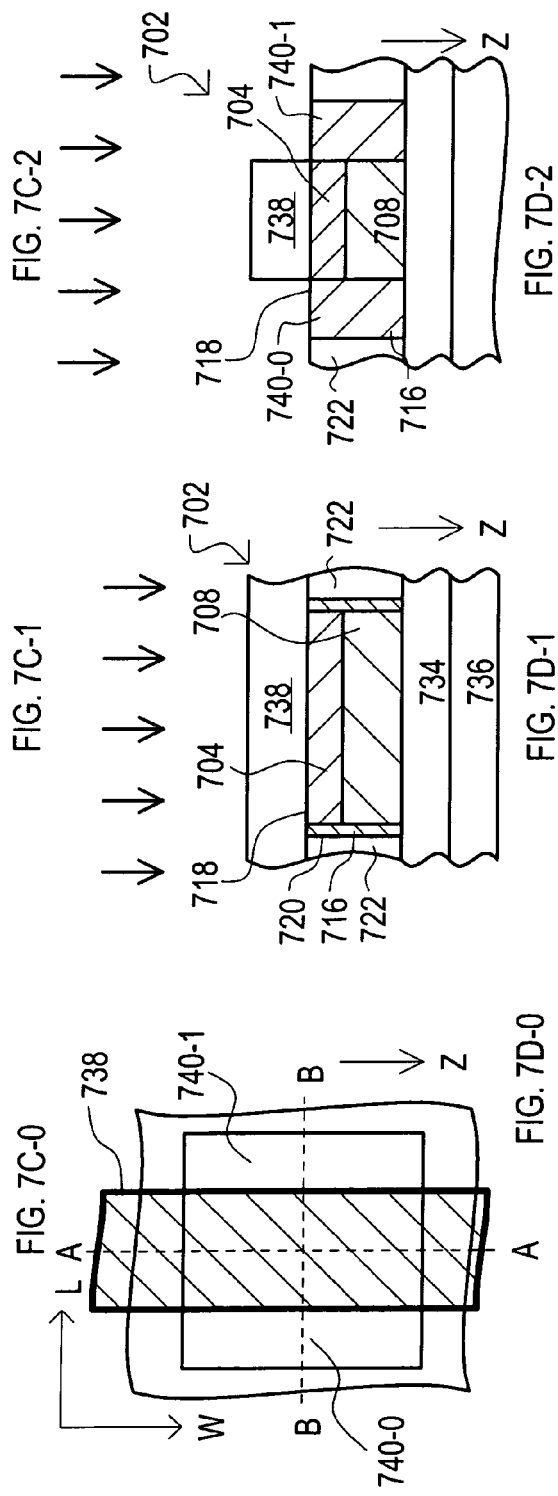

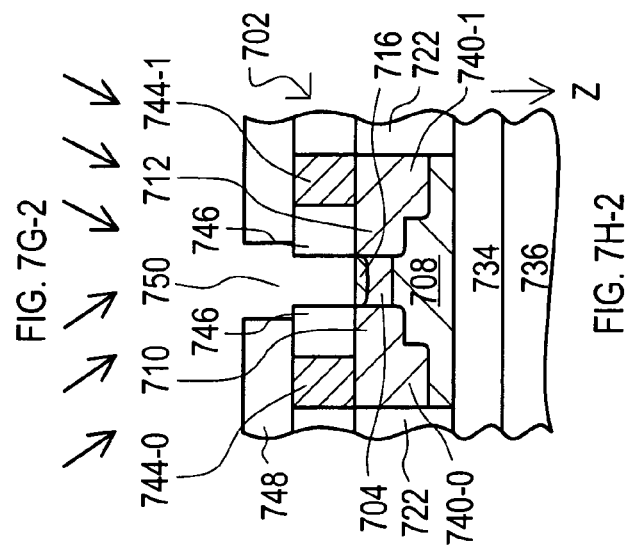
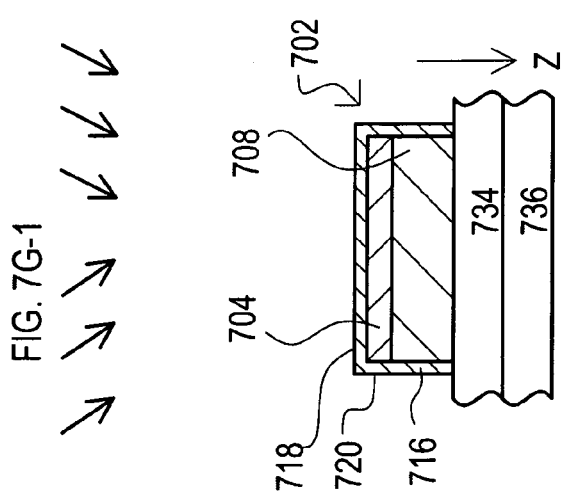
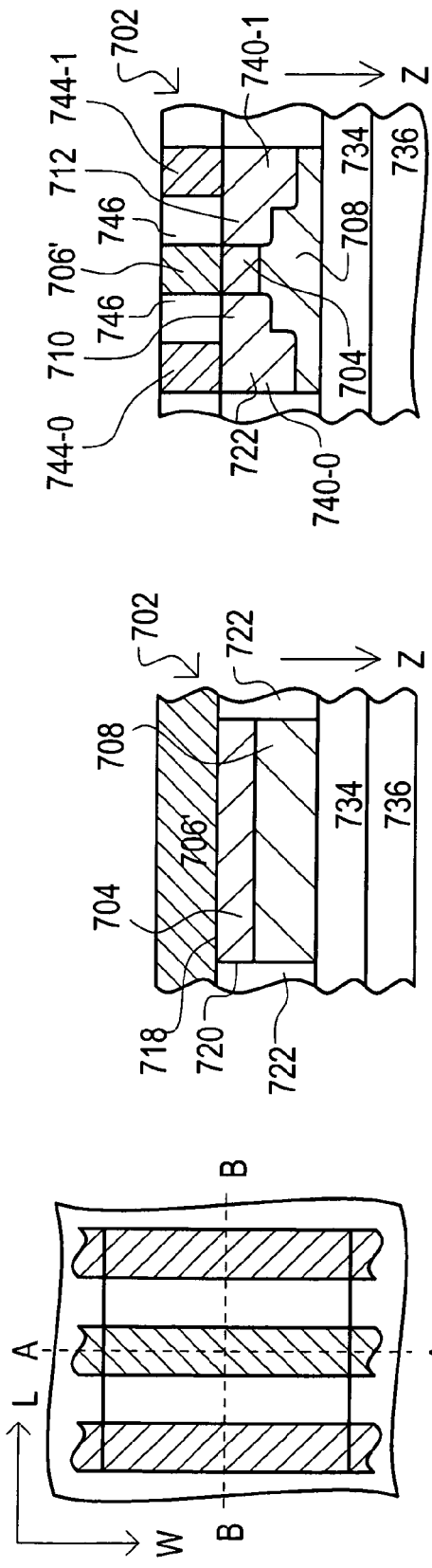
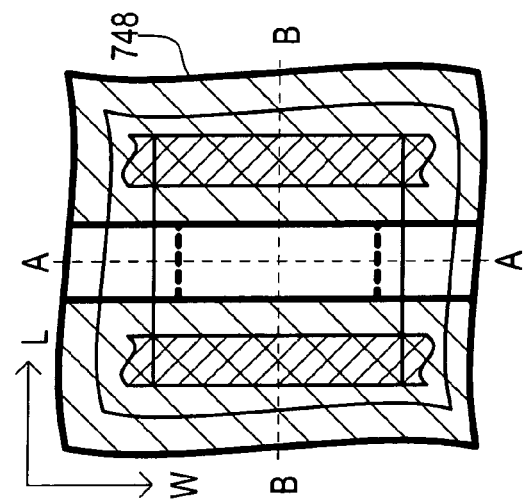

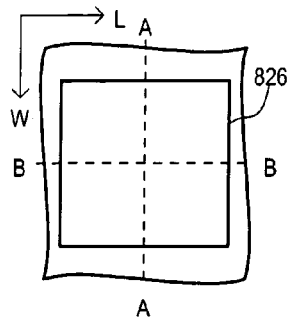
FIG. 8A-0
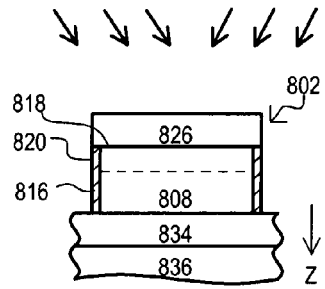
FIG. 8A-1
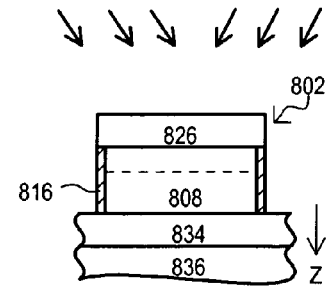
FIG. 8A-2
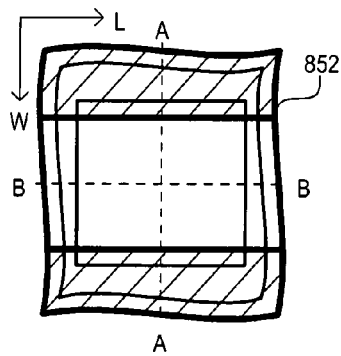
FIG. 8B-0
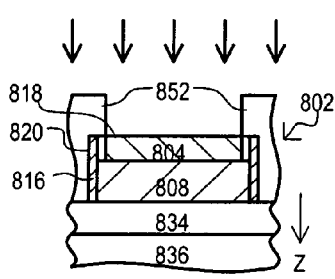
FIG. 8B-1
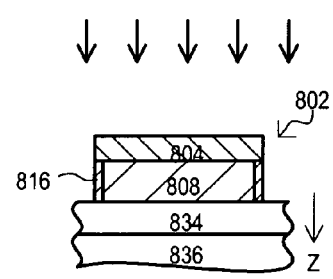
FIG. 8B-2
FIG. 9A
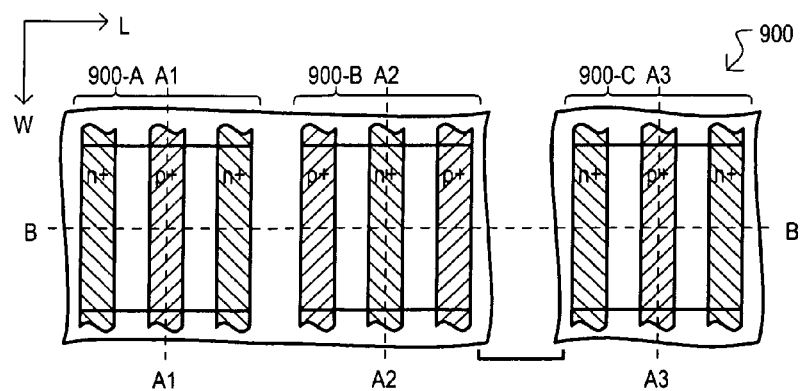

US 7,943,971 B1

JUNCTION FIELD EFFECT TRANSISTOR (JFET) STRUCTURE HAVING TOP-TO-BOTTOM GATE TIE AND METHOD OF MANUFACTURE

TECHNICAL FIELD

The present invention relates generally to semiconductor integrated circuit devices, and more particularly to integrated circuit devices having one or more junction field effect transistors (JFET) having a top gate electrically connected to a bottom gate.

BACKGROUND OF THE INVENTION

Field effect transistors (FETs) typically include a semiconductor material having a channel region formed between a source region and a drain region. A conductivity of the channel region can be controlled according to a voltage applied to a control gate. To better understand various features of the disclosed embodiments, a conventional junction FET will now be described.

Referring to FIGS. 14A to 14C, a conventional JFET is shown in a series of views and designated by the general reference character 1400. FIG. 14A is a top plan view. FIG. 14B is a side cross sectional view taken along line B-B of FIG. 14A. FIG. 14C is a side cross sectional view taken along line C-C of FIG. 14A.

Conventional JFET 1400 can include a gate 1402, a channel 1404, a source 1406, and a drain 1408. All of these regions (1402 to 1408) can be formed within a silicon substrate 1410. The particular conventional JFET 1400 shown is a p-channel JFET, thus a channel 1404, source 1406, and drain 1408 can be p-doped regions, while a gate 1402 can be an n-doped region. Conventional JFET 1400 can be formed in an active region 1412 that can be an n-doped region.

Electrical contact with source 1406 and drain 1408 can be made by metal source contact 1414 and metal drain contact 1416.

As shown in FIG. 14C, a metal gate contact 1418 can make electrical contact with a gate contact diffusion 1420. Such an arrangement can enable gate 1402 and active region 1412 to be commonly driven by metal gate contact 1418.

In addition to conventional silicon-based JFET, transistors based on other semiconductor materials are known. As but one example, a metal epitaxial semiconductor FET (MESFET) can be formed on a gallium arsenide (GaAs) substrate. In such an arrangement, a bulk region formed below a channel can serve as an insulating layer. That is, such a conventional GaAs transistor includes a top gate, but not a bottom gate.

BRIEF SUMMARY OF THE INVENTION

A junction field effect transistor (JFET) formed on a conductive semiconductor such as silicon or germanium can include a top gate structure and an active semiconductor region. The active semiconductor region can include a side surface and a top surface formed below the top gate structure. The active semiconductor region can also include a channel region formed below the top gate structure, a bottom gate region formed below the channel region, and a gate tie region formed on the side surface that makes an electrical connection between the top gate structure and the bottom gate region.

BRIEF DESCRIPTION OF THE DRAWINGS

FIGS. 2A-0 to 2B-1 are various views showing a method of forming a JFET like that of FIGS. 1A to 1C, according to an embodiment.

FIGS. 3A to 3B-1 show a gate tie region formation step according to an embodiment.

FIGS. 4A to 4C show a gate tie region formation step according to another embodiment.

FIGS. 7A-0 to 7I-2 show methods of fabricating a JFET according to various embodiments, including different points in the method at which a gate tie region formation step can take place.

FIGS. 8A-0 to 8B-2 show a gate tie region formation step according to yet a further embodiment.

FIGS. 9A to 9C show an integrated circuit according to one embodiment.

DETAILED DESCRIPTION OF THE EMBODIMENTS

Figure 1A:
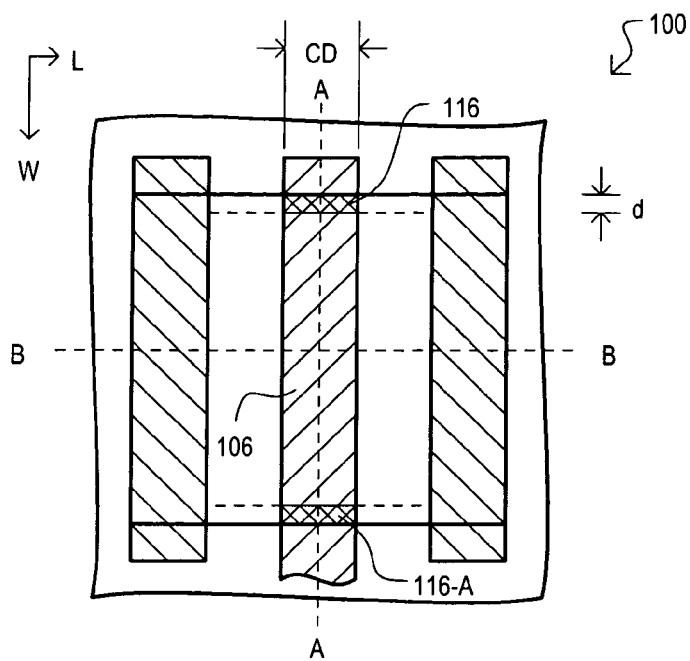
FIGS. 1A to 1C are various views of a junction field effect transistor (JFET) according to a first embodiment.

Various embodiments of the present invention will now be described in detail with reference to a number of drawings. The embodiments show structures and methods of fabricating a junction field effect transistor (JFET) having a conductive gate tie between a top gate and a bottom gate. Such a gate tie can allow a channel conductivity to be controlled by a voltage applied to both gates simultaneously. At the same time, a conductive connection between such gates occupies minimal circuit area, and can essentially not increase the area needed for the JFET.

In the various figures below, like sections are referred to by the same reference characters but with the leading digits corresponding to the figure number.

Figure 1B:
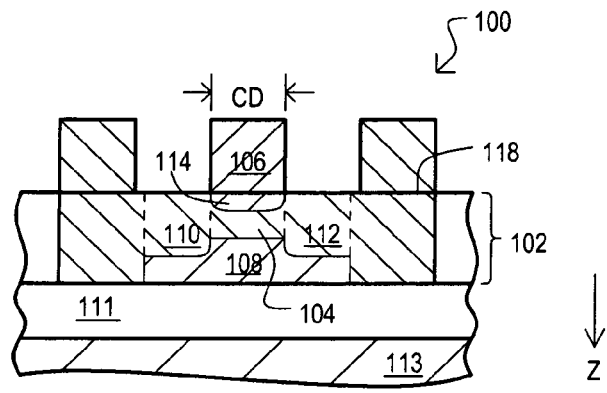
Figure 1C:
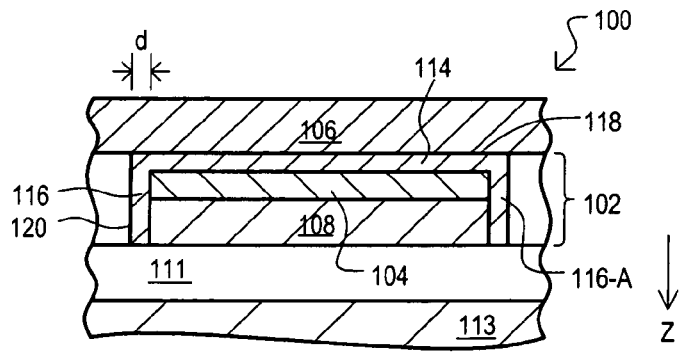

Referring now to FIGS. 1A to 1C, a JFET according to a first embodiment is shown in a series of views and designated by the general reference character 100. FIG. 1A is top plan view. FIG. 1B is a side cross sectional view taken along line B-B of FIG. 1A. FIG. 1C is a side cross sectional view taken along line A-A of FIG. 1A. Preferably, a JFET device 100 can be a JFET formed in a semiconductor on insulator substrate, such as a silicon-on-insulator (SOI), as but one example.

A JFET device 100 can be a formed in an active region 102, and can include a channel region 104, a gate electrode structure 106, a second gate (or well) 108, a first (source) link region 110, a second (drain) link 112, and a gate substrate region 114. An active region 102 can be formed on an insulating layer 111, which can be formed on a bulk substrate 113.

A JFET 100 like that of FIGS. 1A to 1C can include a gate tie region 116 formed on a surface of active region 102 that provides a conductive connection between a gate electrode structure 106 and a second gate 108.

The JFET made on a semiconductor-on-insulator substrate of FIGS. 1A to 1C will now be described in more detail.

Active region 102 can be formed form a semiconductor material, preferably silicon, even more preferably essentially monocrystalline silicon, including "strained" silicon or silicon germanium alloy. In addition, an active region 102 can be formed with a semiconductor-on-insulator process, such as silicon-on-insulator (SOI), in which case active region 102 can be an electrically isolated region in both a vertical direction and horizontal direction (such directions be determined with respect to the underlying substrate).

Figures 0, 1, 2, 7E, 7F:
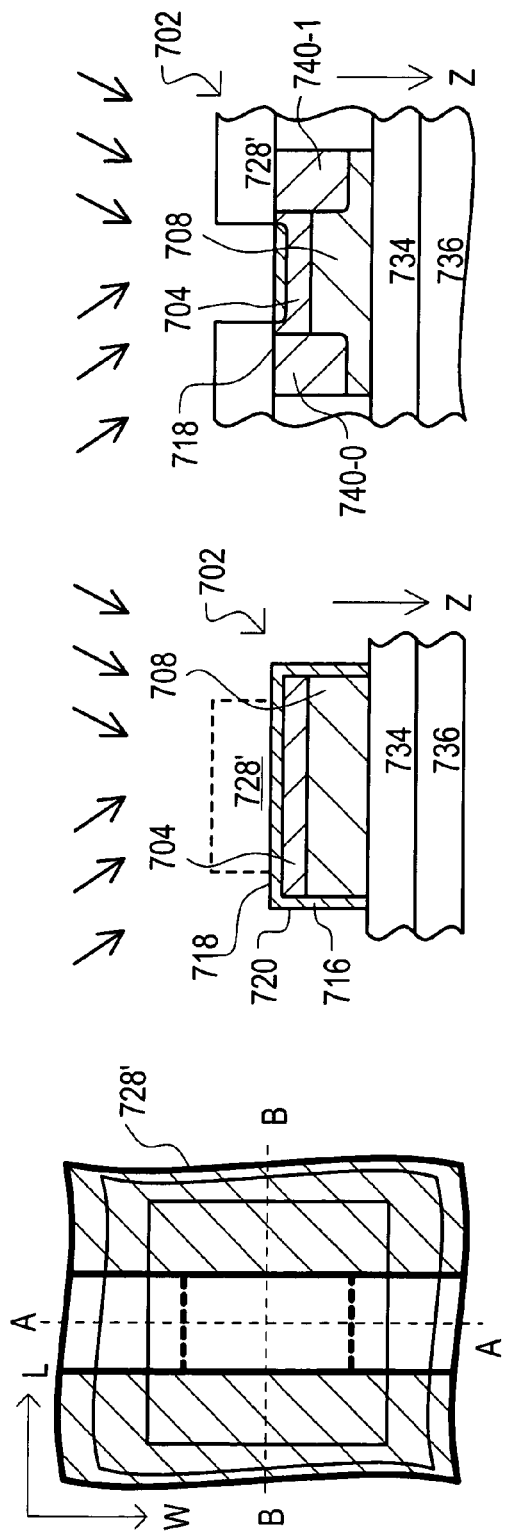

Active region 102 can be conceptualized as including a first surface 118 and a second surface 120. In the arrangement of FIG. 1, a first surface 118 can be a top surface that can extend in a first direction (either direction W or L, as shown in FIGS. 1A to 1C). A second surface 120 can be a side surface that extends in a second direction (shown as Z in FIG. 1C).

A channel region 104 can be formed from a portion of active region 102, doped to a particular conductivity type (e.g., p-type or n-type) according to the type of JFET formed. In the case of an n-channel JFET, a channel region 104 can be doped to n-type conductivity, and in the case of a p-channel JFET, a channel region 104 can be doped to p-type conductivity.

A gate electrode structure 106 can be formed on, and contact with, a first surface 118, on one side of a channel region 104 (in this example a top side). Preferably, a gate electrode structure 106 can be formed from a semiconductor layer formed on active region 102 that is subsequently patterned. Even more particularly, a gate electrode structure 106 can include doped polycrystalline silicon. A gate electrode structure 106 is doped to a conductivity type opposite to that of channel region 104.

A second gate 108 can be a portion of active region 102 doped to the same conductivity type as the gate electrode structure 106. Second gate 108 can be formed on a different side of the channel region 104 with respect to gate electrode structure 106. In the example shown, second gate 108 can be adjacent to a bottom surface of channel region 104.

First and second link regions (110 and 112) can be portions of active region 102 formed in a first surface 118 on either side of channel region 104. First and second link regions (110 and 112) can be adjacent to, but essentially not below a gate electrode structure 106. First and second link regions (110 and 112) are doped to a same conductivity type as channel region 104, but have a higher dopant concentration. First link region 110 can form part of a source of JFET 100, while second link region 112 can form part of a drain of JFET 100.

A gate substrate region 114 can be a portion of active region 102 that is formed below gate electrode structure 106, and doped to a conductivity type different from that of channel region 104. A gate substrate region 114 can form a first gate for JFET 100.

As noted previously, a gate tie region 116 can provide electrical connection between second gate 108 and gate electrode structure 106. In the example of FIGS. 1A to 1C, a gate tie region 116 can be a portion of active region 102 formed in second surface 120 in contact with both a second gate 108 as well as a gate substrate region 114 and/or gate electrode structure 106. For example, if gate tie region 116 is considered to run up to first surface 118, gate tie region 116 can contact gate electrode structure 106 directly. However, if gate substrate region 114 is not considered to run to first surface 118, then gate tie region 116 can have an electrical connection to gate electrode structure 106 via gate substrate region 114. Gate tie region 116 can be doped to the same conductivity type as gate electrode structure 106, second gate 108, and gate substrate region 114.

A gate tie region 116 can advantageously consume little area in an overall JFET device. As shown in FIGS. 1A to 1C, a gate tie region 116 can extend into second surface 120 to about a distance "d". Such a value can be less then critical dimensions otherwise achievable by a process used to manufacture JFET 100. As but a first example, a channel region 104 can have a length in the direction shown as "CD". A distance "d" can be less than this channel length "CD". Similarly, a gate electrode structure 106 can have a width in the direction (also "CD"). Such a width (e.g., minimum achievable feature size) can be larger than distance "d". In particular embodiments, a channel 104 may be self-aligned with gate electrode structure 106. In such cases a gate length may be essentially the same as a value CD. However, alternate embodiments may include gate electrode structures 106 that may overlap a channel length.

A gate tie region 116 can be formed below a gate electrode structure 106 in more than one location. Thus, as shown in FIGS. 1A and 1C, a gate tie region 116-A can exist on a surface region opposite to that of second surface 120. Still further, while a gate tie region 116 can be restricted to regions below a gate electrode structure 106, in other arrangements, a gate tie region can extend all along an edge of a second surface of active region. In such configurations, one or more of gate tie regions (116, 116-A) can be formed (shown by dashed lines).

It is noted that particular embodiments, a gate tie region 116-B can be self-aligned. That is, forming and patterning gate structure 106 can automatically create a gate tie region (116) in contact with the gate structure. Further, if a follow on implantation step is performed with a doping opposite to that of a channel region (a "link" region doping), the resulting channel region can be self-aligned to the gate in a channel length. In such an arrangement, a doping concentration of a gate tie region can be greater than that of a channel region. Further, a doping concentration of a link region can be greater than that of a gate tie region.

In this way, a JFET can have a first (e.g., top) gate and a second (e.g., bottom) gate connected to one another by a gate tie portion formed on a side of an active region. Thus, driving of both first and second gates can be achieved without a large area consuming structure, such as a contact.

Referring to FIGS. 2A-0 to 2B-1, a method of making a JFET like that of FIGS. 1A to 1C is shown in a series of views. FIGS. 2A-1 and 2B-1 are side cross sectional views taken along line A-A shown in FIGS. 2A-0 and 2B-0, respectively.

Referring to FIGS. 2A-0 and 2A-1, an active area region 102 can be formed from a semiconductor material. As shown, second surface 120 can be exposed. A gate tie region 116 can be formed on exposed surfaces of active area region 102, including second surface 120. As will be described in more detail below, the amount by which a gate tie region 116 extends along a second surface 120 can be constrained by a mask or may not be constrained by mask. In the former case, a gate tie region 116 may be limited in the "W" direction. In the latter case, a gate tie region 116 can extend along essentially all of second surface 120 in the direction "W". In the particular example of FIGS. 2A-0 and 2A-1, an active area 102 may be formed by forming a mask 126 over an active area region, and then etching through such a region to form active area 102.

Referring to FIGS. 2B-0 and 2B-1, a second gate 108 and channel region 104 may be formed. In addition, a lateral insulation 122 can be formed adjacent to second surface 120. Such lateral insulation 122 can be planarized. An electrode layer 124 can be formed on, and contact with, a first surface 118. In one arrangement, a gate substrate region 114 can be formed on first surface 118 prior to forming electrode layer 124. In addition or alternatively, all or a portion of a gate substrate region 114 can be formed after forming electrode layer 124, by outdiffusion of dopants from electrode layer 124 into first surface 118, for example. Such a step can create a conductive connection between a second gate 108, gate tie region 116, and a subsequently formed gate electrode structure.

Subsequently, electrode layer 124 can be patterned to form a gate electrode structure 106, and arrive at a JFET configuration like that shown in FIGS. 1A to 1C.

In this way, a gate tie region can be formed on a surface, such as a side surface of an active area, to electrically connect one (e.g., bottom) gate of a JFET with another (e.g., top) gate of the JFET.

As noted above, formation of a gate tie region (e.g., 116) can include masking or not masking a second surface (e.g., 120). One example of a step for forming a gate tie region without masking a second surface is shown in FIGS. 3A to 3B-1. FIGS. 3B-1 is a side cross sectional view taken along either line A-A or line B-B of FIGS. 3B-0.

FIGS. 3A to 3B-1 show a tilt ion implantation step for forming gate tie regions on a side surface 320.

Referring to FIG. 3A, a starting substrate may include a base layer 333, an active layer 331 and a hard mask layer 326'. A base layer 333 may be an insulating layer for example. An active layer 331 can be a semiconductor layer from which JFET active regions can be formed. A hard mask layer 326' can be patterned to form a hard mask for etching active layer 331 into separate active regions.

Referring still to FIG. 3A, an active defining mask 335 may be formed on hard mask layer 326'. An active defining mask 335 may define regions where active areas are to be formed (shown by dashed lines 302). For example, an active defining mask 335 may be an etch mask for hard mask layer 326', that allows an active area pattern to be transferred to hard mask layer 326'. As but one example, active defining mask 335 may be formed from a photoresist using a photolithography step.

Referring to FIGS. 3B-0 and 3B-1, in one embodiment, with active defining mask 335 serving as an etch mask, active mask 326 may be formed from hard mask layer 326'. Active defining mask 335 may then be removed, to leave active mask 326 over active layer 331. Active mask 326 may then serve as an etch mask, to etch active region 302 from active layer 331.

An active mask 326 can protect active regions (i.e., islands) in an etch step that creates such islands. Such a mask can be formed from silicon oxide, silicon nitride, or a combination thereof, as but a few examples.

Unlike conventional approaches, an active mask 326 may be retained as an implant mask. As shown in FIG. 3B-1, an active mask 326 can prevent ions from being implanted into a first surface 318. In addition, an implant mask 328 can be formed, from photoresist, or the like, to prevent ions from being implanted in other portions of a substrate (e.g., such as an opposite conductivity type JFET). However, implant mask 328 includes an opening 330 that can expose a side surface (e.g., second surface 320). Consequently, the tilt ion implantation step can implant ions into surface 320 to form gate tie region 316.

Such tilt ion implantation step can form a gate tie region without having to etch a contact, or a vertical implant mask having a critical dimension opening. Consequently, a top to bottom gate connection can be created without having to increase over all JFET size.

In this way, a gate tie region can be formed on a surface of an active area without masking the surface.

While FIGS. 3A to 3B-1 show an arrangement in which second surface is not masked, other embodiments can use a mask to limit the extents of the gate tie region on the second surface. One such example is shown in FIGS. 4A to 4C. FIG. 4B is a side cross sectional view taken along line B-B of FIG. 4A. FIG. 4C is a side cross sectional view taken along line A-A of FIG. 4A.

FIGS. 4A to 4C show a tilt ion implantation step for forming gate tie regions on a side surface 420. An active region 402 can be formed as in the case of FIGS. 3A and 3B. However, unlike the arrangement of FIGS. 3A and 3B, an implant mask 428 can be formed that limits ion implantation to only portions of opposing surfaces 420 and 420'. In particular, a gate tie region 416 can be limited in the "L" direction on surfaces 420 and 420'.

In this way, a gate tie region can be formed on only a portion of an active area region by utilizing an implant mask in a tilt ion implantation step.

In some cases, the formation of a JFET can involve one or more high temperature steps. If a device already includes dopants formed in semiconductor region, such high temperature steps can undesirably result in such dopants diffusing beyond a desired profile. If it is desired to minimize diffusion profile of a gate tie region, a gate tie formation step can be performed after such high temperature steps. Such an arrangement is shown in FIGS. 5 and 6.

Figure 5:
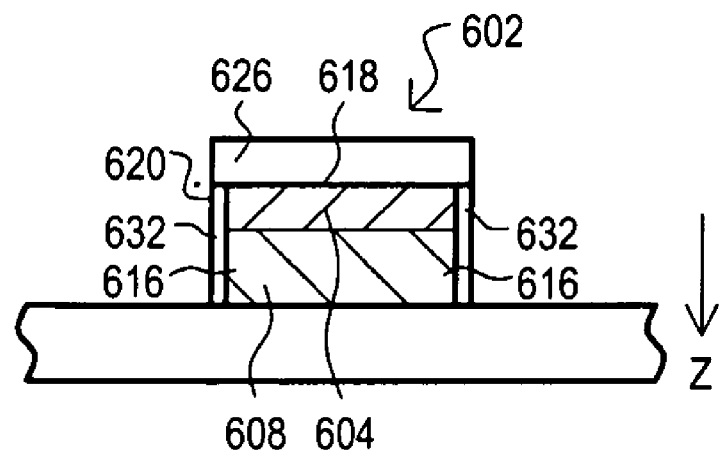
FIGS. 5 and 6 show a gate tie region formation step according to a further embodiment.

FIG. 5 shows a view like that of FIGS. 3B-1, prior to a gate tie tilt implant step, but subsequent to a heat treatment step. Due to the heat treatment step, a thermal film 632 can be formed on exposed surfaces of active area region 602, including second surface 620. As but one example, an active area region 602 can be formed from silicon, and a thermal film 632 can be thermally grown silicon dioxide.

Figure 6:
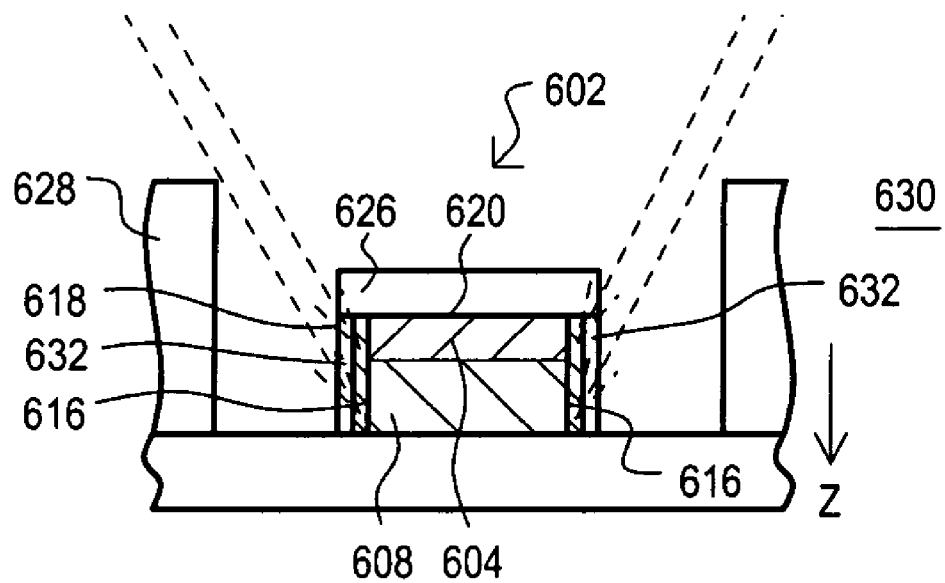

FIG. 6 shows a structure during a tilt ion implantation step. Such a step can implant ions through a thermal film 632 into a second surface 620 to create a gate tie region 616 that can provide a conductive connection between a bottom gate 608 and a top gate structure (not shown). Because gate tie region 616 is formed after the heat treatment step, movement of such dopant due to diffusion can be minimized.

In this way, a gate tie region can be performed after a heat treatment processing step, to minimize dopant diffusion of the gate tie region, and hence maintain a small gate tie area size.

While the above embodiments have illustrated various ways in which a gate tie region can be formed, the point at which a gate tie region is formed in an overall JFET manufacturing process can also vary. Particular examples describing different points at which a gate tie region can be formed in a JFET formation process will now be described.

Referring to FIGS. 7A-0 to 7I-2, methods of forming a JFET device are shown in a series of views. The methods show that a gate tie region can be formed (a) after defining an active area (FIG. 7B-0-2, 7C0-2), or (b) after formation of a source/drain regions (FIGS. 7E-0 to 7E-2) or even (c) after defining a top gate, through use of a "sacrificial" gate step (FIGS. 7H0 to 7I-2).

Referring to FIGS. 7A-0 to 7A-1, methods can include forming an active etch mask over a semiconductor layer. In the example shown, a JFET is formed on a semiconductor-on-insulator substrate. Accordingly, a semiconductor layer 732 (from which active area regions can be formed) is formed on a substrate insulating layer 734, which is formed on a bulk substrate 736. An active mask 726 can be formed on semiconductor layer 732 that can define a location where a JFET can be formed.

Referring to FIGS. 7B-0 to 7B-1, one example of a point at which a gate tie region can be formed is shown. An active area region 702 can be formed. An active mask 726 can be retained and serves as an implant mask to prevent gate tie dopants from being implanted into first surface 718. A tilt ion implant can then be performed resulting in the creation of gate tie regions 716 on at least a second surface 720.

Referring to FIGS. 7C-0 to 7C-2, a second example of a point at which a gate tie region can be formed is shown. Unlike FIGS. 7B-0 to 7B-2, an active mask 726 can be removed, thus a tilt implant step can be performed with all, or a portion of a first surface 718 exposed. A possible implant mask 728, formed by photoresist for example, is shown by dashed lines. A mask 728 may not be used on other embodiments.

Referring to FIGS. 7D-0 to 7D-2, a method can further include forming a back gate 708, a channel region 704, source and drain regions (740-0 and 740-1). A back gate 708 can be formed, by an ion implantation step, for example. A channel region 704 may then be formed over a back gate 708, also by an ion implantation step, for example. It is noted that the implant dose for the channel region 704 is not sufficient to invert a conductivity type of a gate tie region 716.

A source/drain (S/D) implant mask 738 can be formed over an active area region 702 that can define locations of S/D regions. An ion implantation step can occur resulting in the formation of a first and second S/D region (740-0 and 740-1). Preferably, formation of S/D regions (740-0 and 740-1) can occur after lateral isolation regions 722 are formed (e.g., by a shallow trench isolation step). However, in alternate embodiments, S/D regions (740-0 and 740-1) can be formed prior to such a trench filling step.

While FIGS. 7C-0 to 7D-2 show an arrangement in which a gate implant can occur prior to a source/drain implant, in other embodiments, a gate implant can occur after a source/drain implant. In such cases, a source/drain implant concentration can be higher than that of a gate implant.

Referring to FIGS. 7E-0 to 7E-1, a third example of a point at which a gate tie region can be formed is shown. Following the formation of S/D regions (740-0 and 740-1), a gate tie implant mask 728' can be formed over an active area region 702 that exposes second surface 720. If lateral isolation structure (e.g., 722) were formed by prior fabrication steps, such isolation material can be etched away to expose second surface 720. A tilt ion implantation step can then occur, to form gate tie region 716. It is noted that a gate tie implant mask 728' can cover S/D regions (740-0 and 740-1) to prevent such regions from being implanted with opposite type dopants. Further, as shown by dashed lines, a gate tie implant mask 728' can also cover a portion of first surface 718.

Referring to FIGS. 7F-0 to 7F-2, a method can further include forming "link" regions. Link regions can be regions doped to extend source and drain regions to the limits of a gate electrode structure (i.e., confine a channel region to locations essentially beneath a gate electrode structure). Preferably, link regions are formed by a self-aligned ion implantation step, using a first gate mask structure as an implant mask.

In the particular example shown in FIGS. 7F-0 to 7F-2, if not already formed, lateral isolation structures 722 can be formed. Similarly, if not already formed, a back gate 708 and channel region 704 can be formed. An electrode layer can then be deposited over and in contact with a top surface 718. An electrode layer can then be doped with two or more ion implantation steps, or the like, in locations where a source electrode, gate electrode structure, and drain electrode are to be formed. An etch mask can then be formed over the electrode layer that defines locations where a source electrode, gate electrode structure, and drain electrode are to be formed. Such an etch mask can include a gate structure mask portion 742-0, a source electrode mask portion 742-1, and a drain electrode mask portion 742-2. An etch step, such as an anisotropic reactive ion etch, can be performed to create a gate electrode structure 706, a source electrode 744-0 and a drain electrode 744-1. An ion implantation step can then be performed, as shown in FIGS. 7F-0 to 7F-2, that can create first link region 710 and second link region 712. As shown in FIGS. 7F-2, first link region 710 can be formed in a first surface 718 between first S/D region 740-0 and channel region 704. Similarly, second link region 712 can be formed in a first surface 718 between second S/D region 740-1 and channel region 704.

It is noted that a link formation step can counteract or essentially remove portions of a gate tie region present in first surface 718 or edges of second surface 720 exposed by masks portion 742-0, 742-1, and 742-2.

Referring now to FIGS. 7G-0 to 7I-2, yet another example of a gate tie formation step is shown. This example shows a sacrificial gate approach that can first form a "sacrificial" gate structure, remove such a structure, and then form a gate tie region.

Referring first to FIGS. 7G-0 to 7G-2, a sacrificial gate structure 706', a source electrode 744-0, and a drain electrode 744-1 can be formed, according to steps shown in FIGS. 7F-0 TO 7F-2, or equivalents. A first mask layer 746 can then be formed over first surface 718, covering at least the sides of sacrificial gate structure 706'. A first mask layer 746 can then be planarized to expose a top surface of the gate structure 706'. As but one example, a first mask layer 746 can include silicon nitride.

Referring now to FIGS. 7H-0 to 7H-2, a second mask layer 748 can be formed from photoresist, or the like. Second mask layer 748 can include an opening that exposes sacrificial gate structure 706' as well as portions of lateral isolation structures 722. Sacrificial gate structure 706' can then be removed to create opening 750. In addition, portions of lateral isolation structures 722 exposed by second mask layer 748 can also be removed, resulting in second surface 720 being exposed. A tilt ion implantation can then take place to form gate tie region 716. As shown by dashed lines in FIGS. 7H-0, additional portions of a top surface 718 can be masked with a second mask layer 748.

Figures 2, 7I:
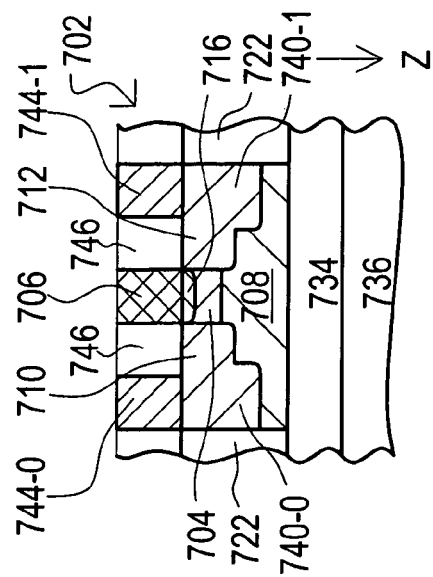
Figures 1, 7I:
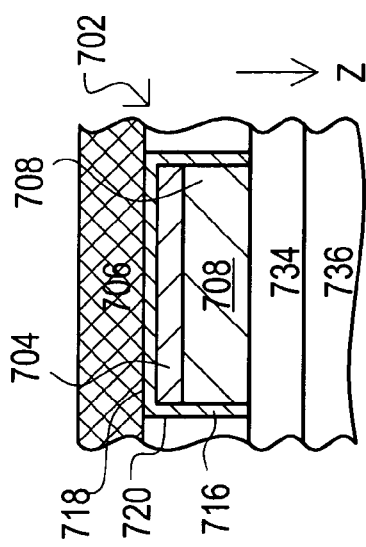
Figures 0, 7I:
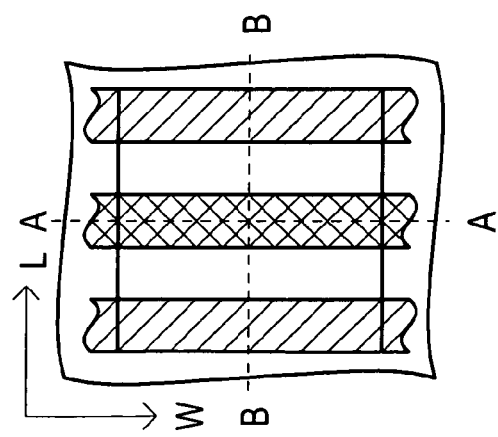

Referring now to FIGS. 7I-0 to 7I-2, a second mask layer 748 can be removed. Lateral isolation structures 722 can be refilled, and opening 750 cleared once more. A gate layer can be deposited to fill opening 750. A planarization step can then be performed to remove portions of gate layer above fill opening 750 to create a gate electrode structure 706.

While FIGS. 7A-0 to 7I-2 have shown arrangements in which a gate tie region can be formed after the formation of a channel region, in very particular arrangements it may be possible to form a gate tie region prior to a channel formation step. One such approach is shown in FIGS. 8A-0 to 8B-2.

Referring to FIGS. 8A-0 to 8A-2, an active area region 802 can be formed, for example, as described in FIGS. 7B-0 to 7B-2, or equivalents. However, a channel region is not yet formed in active area region 802. A second gate 808 may be formed, or in alternate arrangements, may not be formed. A tilt ion implantation step can occur, forming gate tie region 816 prior to the formation of any channel region. In the example shown, an active mask 826 can be present on a first surface 818.

Referring to FIGS. 8B-0 to 8B-2, if not already formed, a second gate 808 can be formed, by an ion implantation step, for example. A channel mask 852 can then be formed over an active area region 802 that can mask gate tie region 816 from opposite conductivity dopants implanted in a channel region formation step. A channel region 804 can then be formed with an ion implantation step, for example.

In this way, a gate tie region can be formed at any of numerous points within a JFET manufacturing process, including before the formation of a channel region, after the formation of a channel region, before or after the formation of source and drain regions, or even after a gate electrode has been formed.

While the above embodiments have shown JFETs and methods of making such JFETs, where a JFET is of one conductivity type, embodiments of the invention can include JFETs of one conductivity type (e.g., n-type or p-type) integrated with like JFETs (i.e., JFETs having first and second tied gates) of the opposite conductivity type (e.g., p-type or n-type), or integrated with JFETs that do not have a first gate tied to a second gate. Particular examples of such an embodiment are shown in FIGS. 9A to 9C.

Figure 9B:
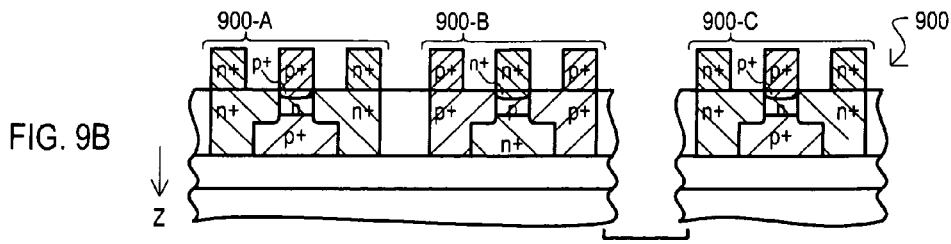
Figure 9C:
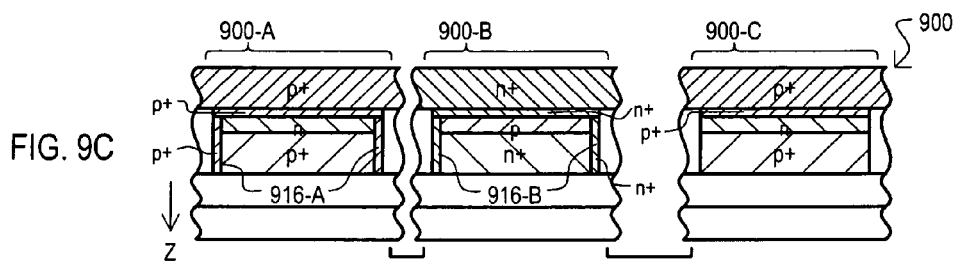

FIGS. 9A to 9C show an integrated circuit having JFETs of complementary conductivity types (e.g., n-channel and p-channel) where such JFETs can include both gate tied JFETs and non-gate tied JFETs. FIG. 9A is a top plan view. FIG. 9B is side cross sectional view taken along line B-B of FIG. 9A. FIG. 9C shows a series of side cross sectional views taken along lines A1-A1, A2-A2 and A3-A3 of FIG. 9A.

Referring to FIGS. 9A to 9C, an integrated circuit 900 can include a gate tied NJFET 900-A, gate tied PJFET 900-B, and an NJFET 900-C that is not gate tied (referred to herein as a separated gate JFET). A gate tied NJFET 900-A can have the structure of, and be formed according to the embodiments described herein, or equivalents. Similarly, a gate tied PJFET 900-B can have the structure of, and be formed according to the embodiments described herein, or equivalents, but have opposite conductivity type structures as compared to gate tied NJFET 900-A. PJFET 900-B can be masked during NJFET 900-A formation steps, and vice versa.

FIGS. 9A to 9C also show a separated gate NJFET 900-C. A separated gate NJFET 900-C can have a similar structure to that of NJFET 900-A, but does not include a gate tie region 916-A. NJFET 900-C can be formed with the same steps as NJFET 900-C but can be masked during gate tie region formation steps. As a result NJFET 900-C does not include a gate tie region. Of course, an integrated circuit 900 could also include a separated gate PJFET.

In this way, an integrated circuit can include gate tied JFETs of different conductivity types, as well as separated gate JFETs.

While the above embodiments have shown JFETs formed with semiconductor-on-insulator substrate, embodiments of the present invention can also include JFETs formed in a "bulk" substrate. One particular example of such an arrangement is shown in FIGS. 10A to 10C.

Figure 10A:
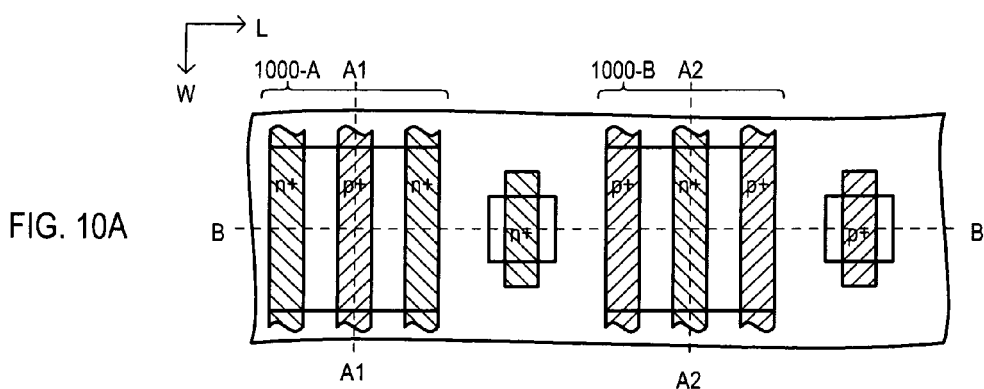
FIGS. 10A to 10C show an integrated circuit according to another embodiment.
Figure 10B:
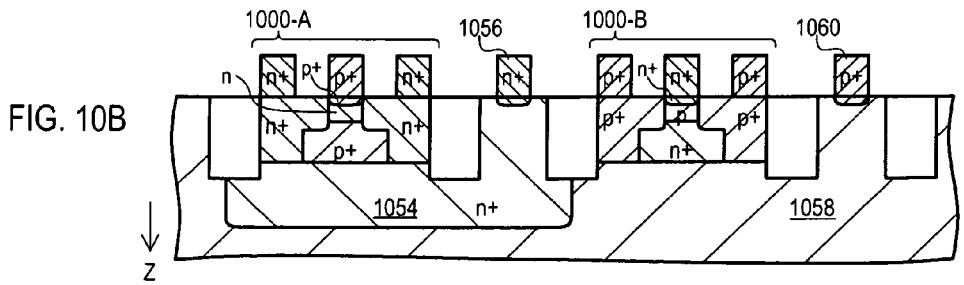
Figure 10C:
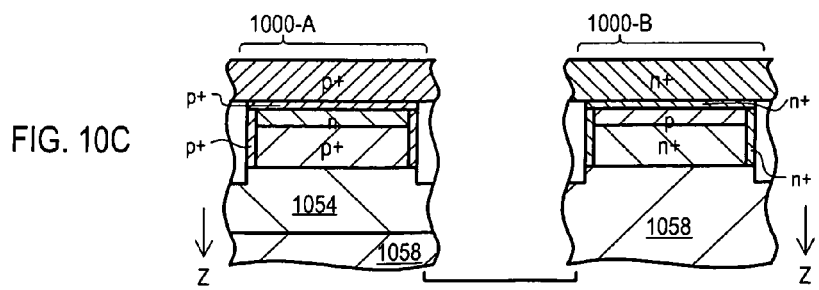

FIGS. 10A to 10C show an integrated circuit having an NJFET with first and second gates tied to one another and a p-channel PJFET with first and second gates tied to one another. FIG. 10A is a top plan view. FIG. 10B is side cross sectional view taken along line B-B of FIG. 10A. FIG. 10O shows a series of side cross sectional views taken along lines A1-A1 and A2-A2 of FIG. 10A.

Gate tied NJFET 1000-A can have the structure of, and be formed according to the embodiments described herein, or equivalents, but be preceded by an n-well formation step that can form n-well 1054. Further, an n-well tap electrode 1056 can be formed that can bias n-well 1054. Gate tied PJFET 1000-B can have the structure of, and be formed according to the embodiments described herein, or equivalents. Further, a p-substrate tap electrode 1058 can be formed that can bias a p-substrate region 1060.

In this way, an integrated circuit can include gate tied JFETs of different conductivity types formed in a "bulk" type substrate.

While the above embodiments have shown arrangements in which a second (e.g., side) surface of an active area may be dopes by a tilt ion implantation operation, alternate embodiments may utilize non-tilt implants to dope such surfaces. One particular example of such an embodiment is shown in FIGS. 11A to 11D.

Figure 11A:
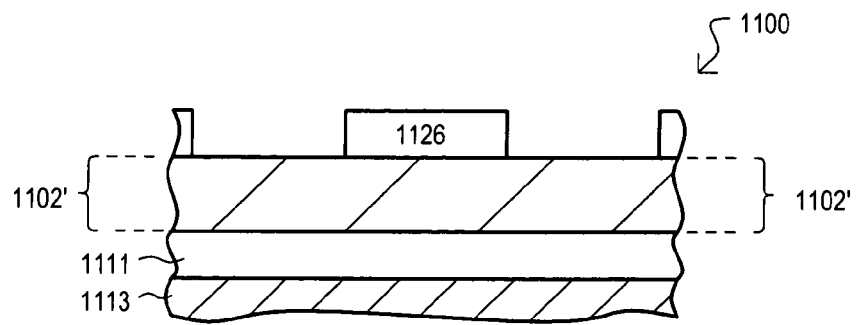
FIGS. 11A to 11D show a method of fabricating a JFET according to another embodiment.

Referring to FIG. 11A, an etch mask 1126 may be formed over an active layer 1102'. In the particular example shown, active layer 1102' can be a semiconductor layer formed over an insulating layer 1111 that is formed on a bulk semiconductor substrate 1113.

Figure 11B:
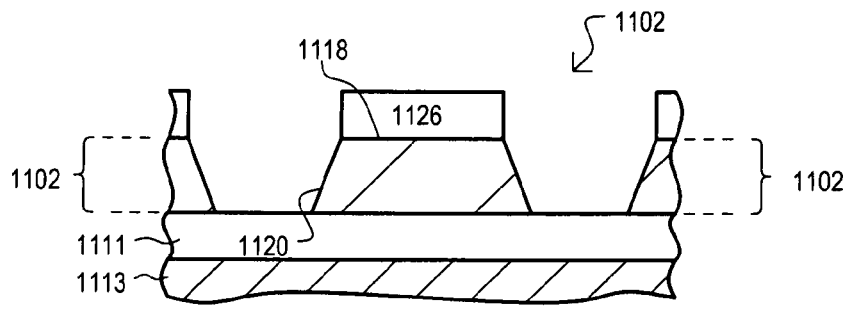

Referring to FIG. 11B, an active layer (1102') may be etched in regions not covered by etch mask 1126 to form an active area 1102. However, such an etch may have some degree of isotropy. As a result, a second surface 1120 may not be perpendicular with respect to a first (e.g., top) surface 1118 of active area 1102, and extend outward from under etch mask 1126. While FIG. 11B shows an essentially straight cross sectional profile to second surface 1120, such a surface may be curved and otherwise vary according etch type and/or etch parameters.

Figure 11C:
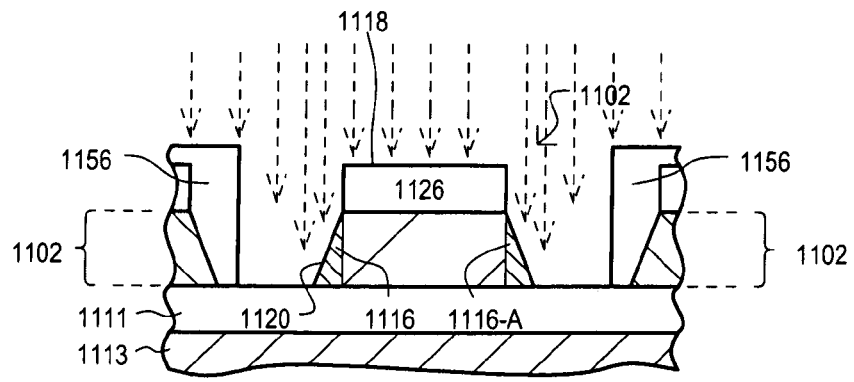

Referring to FIG. 11C, a side surface doping step can take place. In the particular example shown, such a step may include ion implantation that is not at a tilt angle. While etch mask 1126 may prevent dopants from being implanted into a top surface of active area 1102, because side surfaces extend from under etch mask 1126, such a step may form a gate tie region in a side surface. FIG. 11C shows the formation of gate tie regions 1116 and 1116-A. The example of FIG. 11C also shows the formation of an implant mask 1156. An implant mask 1156 may prevent the formation of gate tie regions in other active areas.

Figure 11D:
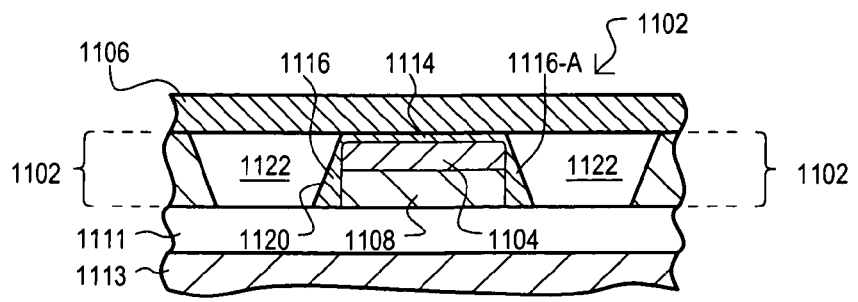

Referring to FIG. 11D, a back gate 1108 and channel region 1104 may be formed in active area. In addition, a gate electrode structure 1106 may be formed over and in contact with active area 1102. A gate electrode structure 1106 can have a conductive connection to the back gate 1108 by way of gate tie regions (1116 and/or 1116-A). The particular example of FIG. 11D shows the creation of a gate substrate region 1114 in contact with a gate electrode structure 1106. A gate substrate region 1114 can be of the same conductivity type as gate electrode structure 1106, gate tie regions (1116 and 1116-A), and back gate 1108. As but a two examples, a gate substrate region 1114 may be formed by outdiffusion of dopants from a gate electrode structure 1106, and/or may be formed by a doping step prior to the formation of the gate electrode structure 1106.

In this way gate tie regions may be formed without a tilt ion implantation step.

While the above embodiments have illustrated various fabrication methods, other embodiments can be expressed as a series of steps. Two particular such method embodiments will now be described.

Figure 12:
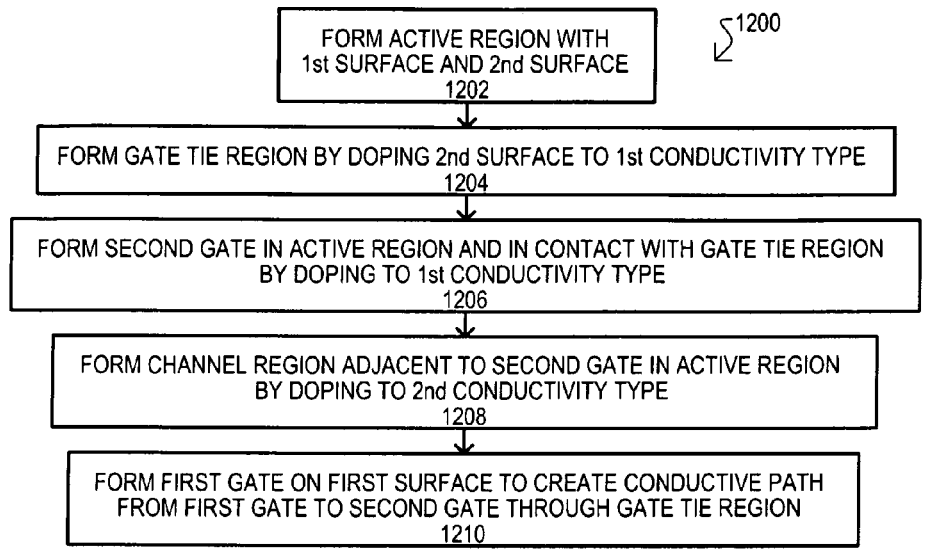
FIG. 12 is a flow diagram of a method according to one embodiment.

Referring to FIG. 12, a method according to one embodiment is shown in a flow diagram, and designated by the general reference character 1200. A method 1200 can include forming an active region with a first surface and a second surface (step 1202). A first surface can extend in a different direction than a second surface. Preferably, a second surface can be at an angle greater than 45° with respect to the first surface. A method 1200 can also include forming a gate tie region in the second surface by doping to a first conductivity type (step 1204). In the case of the PJFET such doping can be n-type, and in the case of NFET such a doping can be p-type.

A method 1200 can further include forming a second gate in the active region by doping to the first conductivity type (1206). A channel region may then be formed, adjacent to the second gate, by doping to a second conductivity type (1208). Such an arrangement can form a p-n junction at an interface between the channel region and second gate. Further, a doping of the channel region may be sufficiently low so as to not invert a conductivity type of a gate tie region. In particular arrangements, a resulting gate tie region and second gate can form a contiguous region of the first conductivity type.

A method 1200 can also include forming a gate electrode on the first surface that creates a conductive path from the first gate to the second gate through the gate tie region (step 1210). After such a step, a resulting structure can include a first gate of a JFET and a second gate of a JFET that can be commonly driven with a same control voltage.

Figure 13:
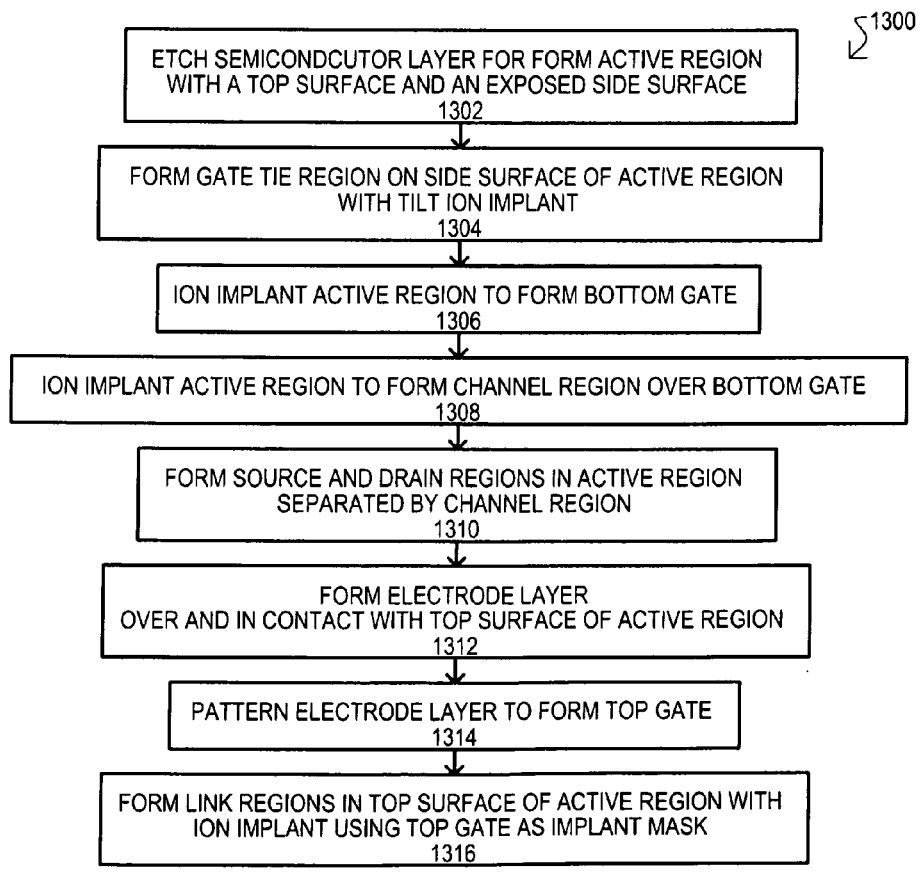
FIG. 13 is a flow diagram of a method according to another embodiment.
Figure 14A:
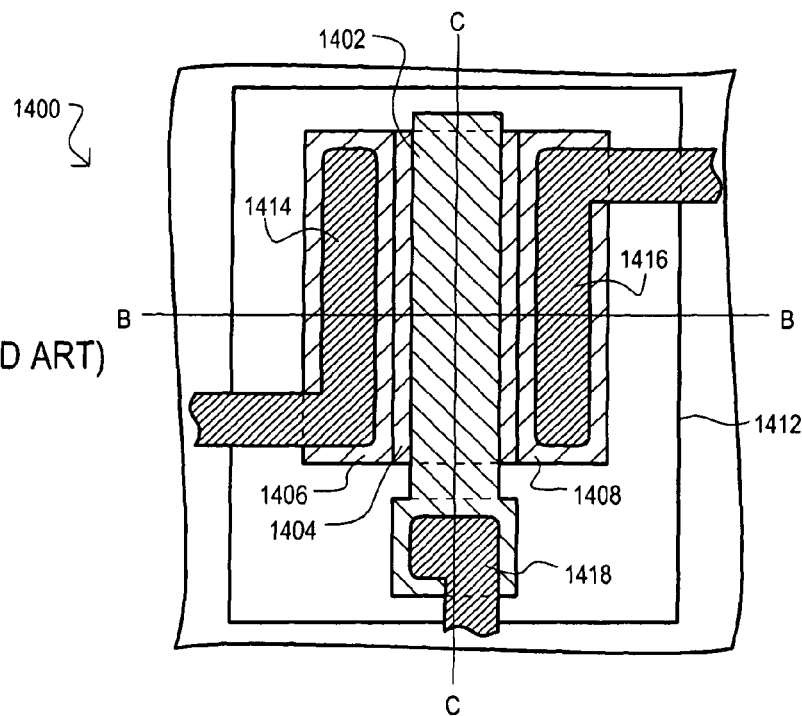
FIGS. 14A to 14C are a series of views showing a conventional JFET.
Figure 14B:
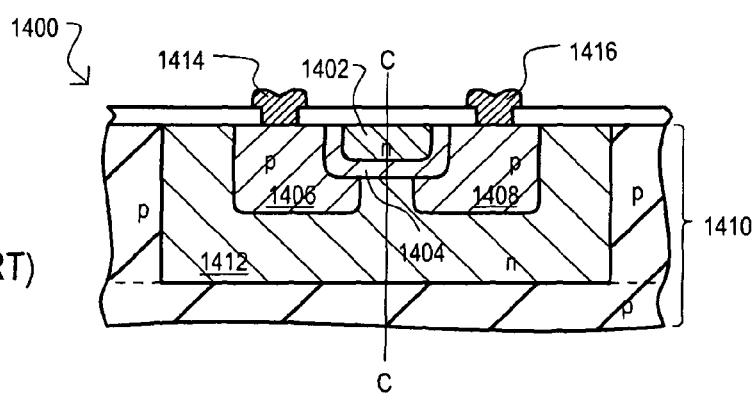
Figure 14C:
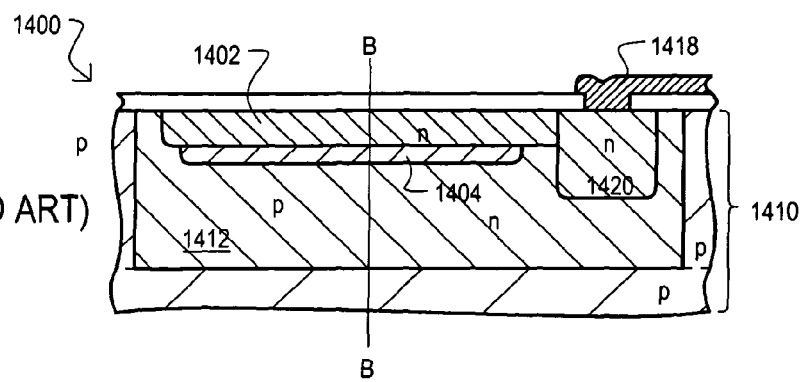

Another method is shown in a flow diagram in FIG. 13, and designated by the general reference character 1300. A method 1300 can include etching a semiconductor layer to form an active region with a top surface and an exposed side surface (step 1302). Method 1300 can further include forming a gate tie region on the side surface of the active region with a tilt ion implantation (step 1304). In the event an active area comprises essentially monocrystalline silicon, such a step can include implanting with an ion implantation dose in the range of about $1 \times 10^{12}/cm^2$ to $1 \times 10^{18}/cm^2$ and at an angle in the range of about 5° to 45° from the vertical with respect to a top surface of the active area. In the case of a gate tie region doped to a p-type conductivity, boron (B) can be implanted at an energy in the range of about 0.1 keV to 20 keV. In the case of a gate tie region doped to an n-type conductivity, phosphorous (P) can be implanted at an energy in the range of about 0.1 keV to 20 keV, while arsenic (As) and antimony (Sb) can be implanted at an energy of about 1 keV to 50 keV. Other methods of doping, such as plasma immersion doping can be used.

A bottom gate can be formed by ion implanting the active region (step 1306). A channel region can be formed over the bottom gate by ion implanting into the active region (step 1306). Preferably, an etched semiconductor layer is monocrystalline silicon.

Method 1300 can further include forming source and drain regions in the active area that are separated by a channel region (step 1310). In particular embodiments, such a step can also include an ion implantation step that masks a portion of the channel region. An electrode layer can be formed over and in contact with a top surface of the active region (step 1312). Preferably, such a layer can be polysilicon. The electrode layer can be patterned to form a top gate (step 1314). In particular embodiments, such a step can also form a source electrode and a drain electrode over and in contact with the source and drain regions. Link regions can then be formed in the active region with an ion implant step that utilizes the top gate as an implant mask (1316). Such an arrangement can "link" source and drain regions to a position adjacent to a top gate, essentially forming a self-aligned source, drain and channel regions.

In this way, various methods can form JFETs having two gates electrically tied to one another.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is, an inventive feature of the invention may include an elimination of an element. Further, particular order of method steps can be switched.

While various particular embodiments set forth herein have been described in detail, the present invention could be subject to various changes, substitutions, and alterations without departing from the spirit and scope of the invention.

What is claimed is:

1. An integrated circuit device, comprising:
   a first junction field effect transistor (JFET) formed on a substrate comprising
   a first gate portion disposed on a first side of a channel region,
   a second gate portion disposed on a second side of a channel region, and
   a gate tie portion formed on a third side of the channel region comprising a semiconductor region doped to the same conductivity type as the second gate portion, the third side being contiguous with the first and second sides; and
   a second JFET formed on the substrate having the same structure as the first JFET, but not including a gate tie portion.

* * * * *